(12) United States Patent
Herr et al.

(10) Patent No.: US 6,420,895 B1
(45) Date of Patent: Jul. 16, 2002

(54) HIGH-SENSITIVITY, SELF-CLOCKED RECEIVER FOR MULTI-CHIP SUPERCONDUCTOR CIRCUITS

(75) Inventors: Quentin P. Herr, Torrance; Mark W. Johnson, La Canada Flintridge, both of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/815,810

(22) Filed: Mar. 23, 2001

(51) Int. Cl.[7] ............................................. H03K 19/195
(52) U.S. Cl. ................................................ 326/3; 326/1
(58) Field of Search ..................... 326/1–3, 4; 327/186, 327/366–367, 527–528

(56) References Cited

U.S. PATENT DOCUMENTS 5,598,105 A * 1/1997 Kurosawa et al. ............. 326/6
5,963,351 A * 10/1999 Kaplounenko et al. ...... 359/158

FOREIGN PATENT DOCUMENTS

JP   02000252811 A * 9/2000

OTHER PUBLICATIONS

K.K. Likharev and V.K. Semenov, "RSFQ Logic/Memory Family: a New Josephson–Junction Technology for Sub--Terahertaz–Clock–Frequency Digital Systems", *IEEE Transactions on Applied Superconductivity*, vol. 1, No. 1, Mar., 1991.

* cited by examiner

*Primary Examiner*—Michael Tokar
*Assistant Examiner*—James H. Cho
(74) *Attorney, Agent, or Firm*—Harness, Dickey & Pierce (57) ABSTRACT

A receiver (50) for providing chip-to-chip communication in a superconductor integrated circuit. The receiver (50) includes a detector circuit (52) for asynchronously receiving an input current, a splitter circuit (60) connected to the detector circuit (52) for generating first and second signals, a delay circuit (62) receiving the second signal from the splitter circuit for generating a delayed signal and a register circuit (64) receiving the first signal from the splitter circuit (60) and the delayed signal from the delay circuit (62) for producing a single flux quantum (SFQ) pulse. The receiver (50) according to the present invention provides an asynchronous chip-to-chip communication between a multi-chip superconductive circuit having low input current without an external rf clock.

20 Claims, 5 Drawing Sheets

HIGH-SENSITIVITY, SELF-CLOCKED RECEIVER FOR MULTI-CHIP SUPERCONDUCTOR CIRCUITS

BACKGROUND OF THE INVENTION

1. Field of the Invention

This invention relates generally to receivers for multi-chip conductor circuits, and more particularly, to high-sensitivity, self-clocked receivers providing chip-to-chip communication for superconductor integrated circuits associated with Single-Flux-Quantum (SFQ) logic.

2. Discussion of the Related Art

With recent developments in superconductor technology, more superconductor devices based on the Josephson effect are replacing conventional devices based on the semiconductor technology for high performance and low power. Digital circuits that employ the superconductor technology are often desirable because these devices enable fast logic with very low power levels, and make possible large amounts of computing power in very compact systems as compared to their semiconductor counterparts. Other benefits of superconducting devices include signal transmission with reduced signal attenuation and noise. Digital circuits that employ superconductor devices can operate at clock speeds in the 10–100 GHz range.

Figure 1:
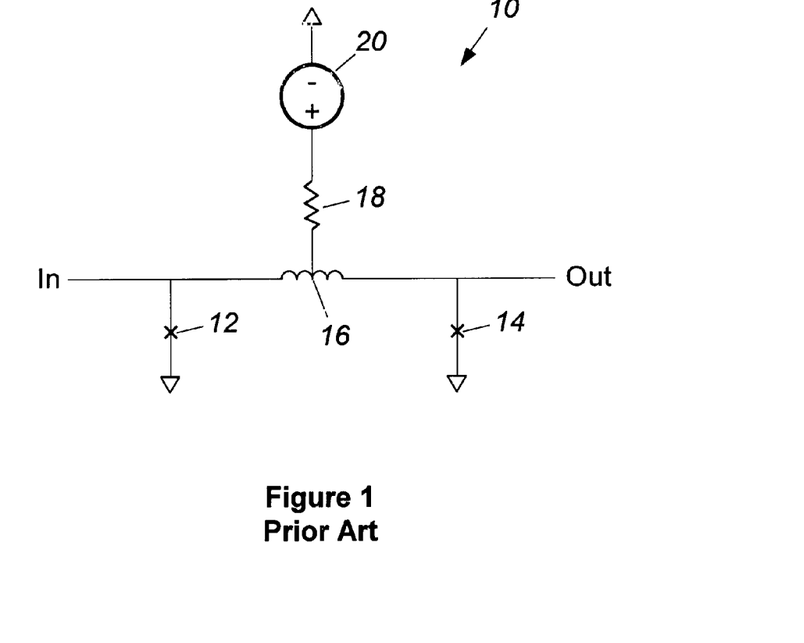
FIG. 1 is a schematic diagram of a Josephson transmission line representative of conventional receivers.

Increases in the circuit speed has made it very difficult to provide adequate chip-to-chip communication without any loss of signal because a receiver needs be very sensitive and asynchronous. Conventionally, Josephson transmission lines (JTL) are employed in superconductor digital circuits to provide on-chip communication and to receive narrow pulse width signals from a driver on its adjacent circuit. However, this method requires the signal transmission bandwidth to be several times the data rate. For chip-to-chip communication, bandwidth is a limiting factor. FIG. 1 is a schematic diagram of a superconducting Josephson transmission line (JTL) 10 that is representative of receivers of the type. The JTL 10 includes a series of Josephson junctions 12 and 14 that are spaced apart at predetermined intervals along the JTL 10. The Josephson junctions 12 and 14 are connected in parallel between a reference ground and an isolation inductor 16, and regenerate Single Flux Quantum (SFQ) pulses at each stage when an input signal is received. The JTL 10 also includes a series of isolation inductors 16 that are connected in a series along the JTL 10 between adjacent Josephson junctions 12 and 14 to provide inductive isolation between adjacent junctions and allow propagation of the SFQ pulse. A biasing resistor 18 is connected to a current source 20 which distributes an equal amount of current to each of the Josephson junctions 12 and 14 to set the phase of each junction.

The Josephson junction 12 and 14 of the JTL 10 functions as a tunneling device including two opposing superconductive films that are separated by an oxide dielectric layer. As an input signal, or the input current impinges on a junction, the input signal splits into two signals that may have roughly equal amounts of the current. One signal goes into the isolation inductor 16 and charges the superconductive films in the associated junction. The other signal goes into the Josephson junction 12,14 and causes the junction to switch, or flip, its internal degree of freedom by 180°. Because the input signal splits into two signals, the input current required to flip the Josephson junction is as much as twice what would normally require a Josephson junction to flip when the current does not split into two signals. Thus, the conventional approach is susceptible only for input signals with large amounts of current, thus resulting in low sensitivity of the device.

Additionally, when the junction flips, each Josephson junction generates a voltage pulse having a fixed time integrated area, and a height determined by the characteristic of the junction. In cases where the junction carries current that is less than a predetermined threshold, the Josephson junction does not acknowledge the input current and cannot regenerate a voltage pulse. On the other hand, when the junction carries current that exceeds a predetermined threshold, the Josephson junction goes into a voltage state where it emits a pulse train or multiple voltage pulses in rapid succession although only one pulse is expected, and leads to erroneous results of the device. Therefore, it is necessary to provide a receiver that is sensitive enough to accurately acknowledge either very small or very large input currents, as well as minimizing any erroneous results.

Several attempts have been made to address the need for high receiver sensitivity by incorporating either an SFQ comparator or a quantum flux parametron. However, such device requires an external clock which makes the device synchronous and cumbersome. The synchronous device requires extra waiting periods for its signals to be transmitted because the device transmits the input signals on either the rising or falling edge of the external clock signal. In addition, some method of clock recovery or timing arbitration is required to synchronize the clock with the data. Thus, the synchronous receiver is not suitable for a high speed device. On the other hand, the asynchronous device transmits its input signals as soon as the signals arrive, thus the input signals do not have to wait for the arrival of the clock signal to be transmitted, and the timing problem is solved.

What is needed is a receiver that is asynchronous yet sensitive enough to sense signals from one chip to another chip in a multi-chip superconductive integrated circuit without an external clock. Therefore, it is an object of the present invention to provide such a receiver that allows chip to chip communication for multi-chip superconductive integrated circuits without loss of signal.

SUMMARY OF THE INVENTION

In accordance with the teachings of the present invention, a receiver for providing chip-to-chip communication in a superconductor integrated circuit is provided. The receiver includes a detector circuit for asynchronously receiving an input current, a splitter circuit receiving the input current from the detector circuit for generating a first signal, a delay circuit receiving the input current from the splitter circuit for generating a delayed signal and a register circuit receiving the first signal from the splitter circuit and the delayed signal from the delay circuit for producing a Single Flux Quantum (SFQ) pulse. The receiver provides an asynchronous chip-to-chip communication between a multi-chip superconductive integrated circuit having low input current without an external rf clock.

Additional objects, advantages, and features of the present invention will become apparent to those skilled in the art from the following discussion and the accompanying drawings and claims.

DETAILED DESCRIPTION OF THE PREFERRED EMBODIMENTS

The following discussion of the preferred embodiments directed to a high-sensitivity, self-clocked receiver providing chip-to-chip communication for superconductor integrated circuits associated with Single-Flux-Quantum (SFQ) logic, is merely exemplary in nature, and is in now way intended to limit the invention or its application or uses.

Figure 2:
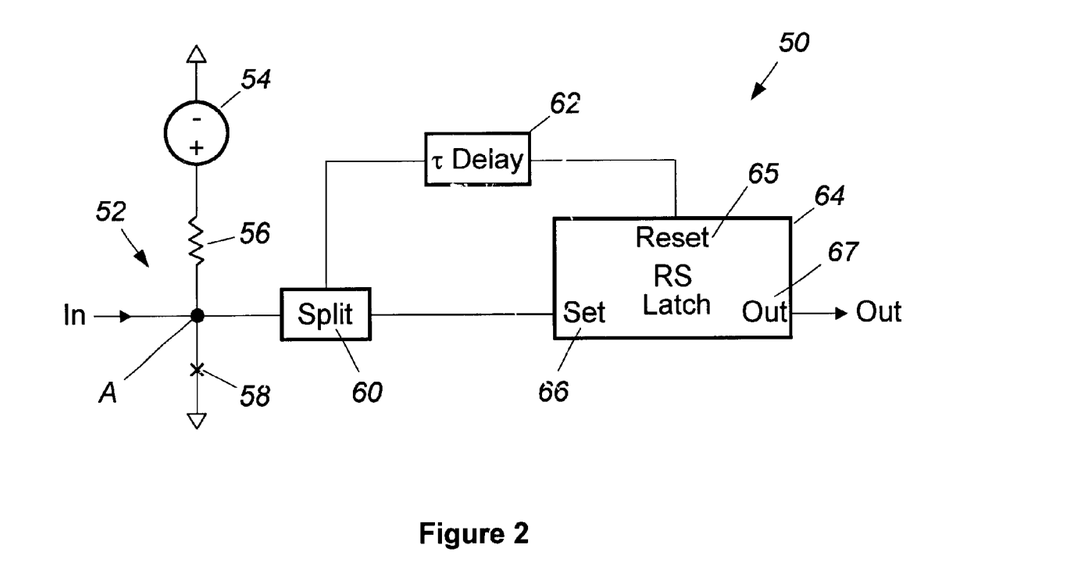
FIG. 2 is a block diagram of a high-sensitivity, self-clocked receiver, according to the present invention.
Figure 3:
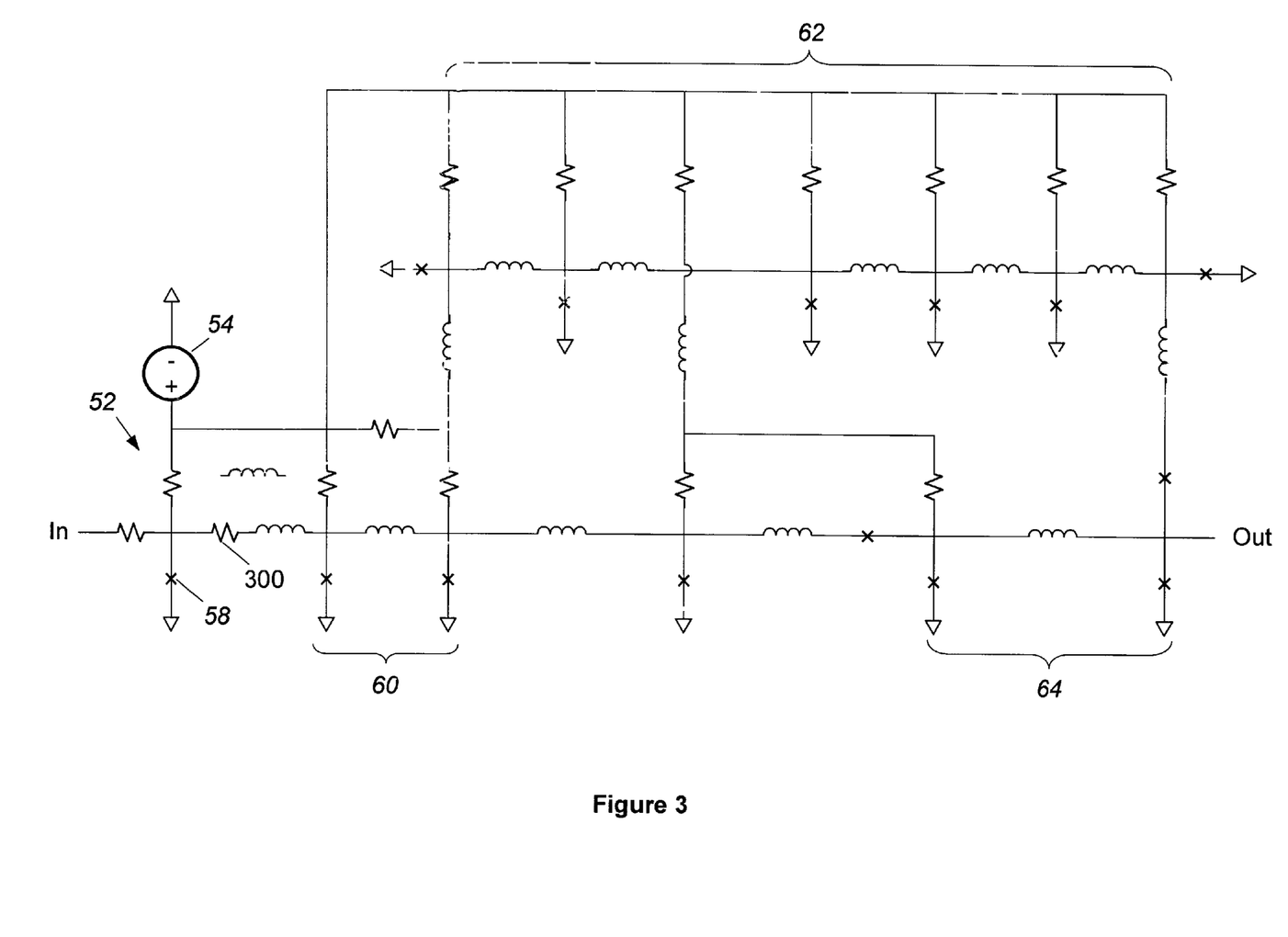
FIG. 3 is a schematic diagram of the high-sensitivity, self-clocked receiver shown in FIG. 2, according to the present invention.

FIGS. 2 and 3 are block and schematic diagrams, respectively, of a single-junction receiver 50 that provides asynchronous chip-to-chip communication through a multi-chip module in accordance with the present invention. The receiver 50 includes a detector circuit 52 for acknowledging an input current and transmitting it to a splitter circuit 60. The splitter circuit 60 reproduces the input current. The receiver 50 also includes a delay circuit 62 connected to the splitter circuit 60 for receiving the input current from the splitter circuit 60 and producing a delayed signal which is identical to the input current delayed in time. Further, the receiver 50 includes a register circuit 64 receiving the reproduced signal from the splitter circuit 60 and the delayed signal from the delay circuit 62 to produce an SFQ output pulse. According to one embodiment of the present invention, a reset/set (RS) latch is used as the register circuit 64. The first signal from the splitter circuit 60 is fed into a set port 66 of the RS latch 64 and the delayed signal from the delay circuit 62 is fed into a reset port 65 of the RS latch 64.

The detector circuit 52 includes a current source 54 and a biasing resistor 56 connected in series with the current source 54. The detector circuit 52 also includes a Josephson junction 58 connected to the biasing resistor 56 at node A. The node A is also connected to an input port of the receiver 50 which receives the input signal, or the input current, from a driver of an adjacent chip. When the input current arrives at the receiver 50, all of the input current goes into the Josephson junction 58 to the reference ground. If the input current exceeds a predetermined threshold, the Josephson junction 58 generates an SFQ pulse, or an SFQ pulse train, which is then transmitted to the splitter circuit 60. In one embodiment of the present invention, the critical current of the Josephson Junction is set at 0.100 mA, and the bias current is set at 0.08 mA.

Unlike the conventional junction of the JTL 10 shown in FIG. 1, the detector circuit 52 does not include an isolation resistor 300 connected between two adjacent Josephson junctions. Therefore, the detector circuit 52 does not divide the input current into two paths where half of the current goes into the Josephson junction 12 and the other half goes into the isolation inductor 16. Instead, all of the input current is directed to the Josephson junction 58 at dc. Therefore, the present invention reduces the input current required to generate the SFQ pulse by the Josephson junction 58 by as much as half. More specifically, the present invention reduces the minimum amount of the input current required to trigger the Josephson junction for switching and producing an SFQ pulse to approximately 0.020 mA. If signal rise time is very fast, however, it may be preferred to omit resistor 300. This may increase circuit operating margins while degrading receiver sensitivity very little.

When the SFQ pulse is regenerated by the Josephson junction 58, the SFQ pulse is transmitted to the splitter circuit 60. The splitter circuit 60 then reproduces the input pulse as a first signal, without any decrease in the pulse voltage amplitude. Subsequently, the splitter circuit 60 distributes the input current to the delay circuit 62 and the first signal to the set port 66 of the RS latch 64. The delay circuit 62 delays the first signal by one-half of the period of the data rate of the input current. For example, if the data rate is set at 10 gigabits per second, which makes the period of the date rate equal to 100 pico-seconds(ps), the delay circuit 62 delays the first signal for 50 ps. The delayed signal is then fed into the reset port 65 of the RS latch 64.

Figure 4:
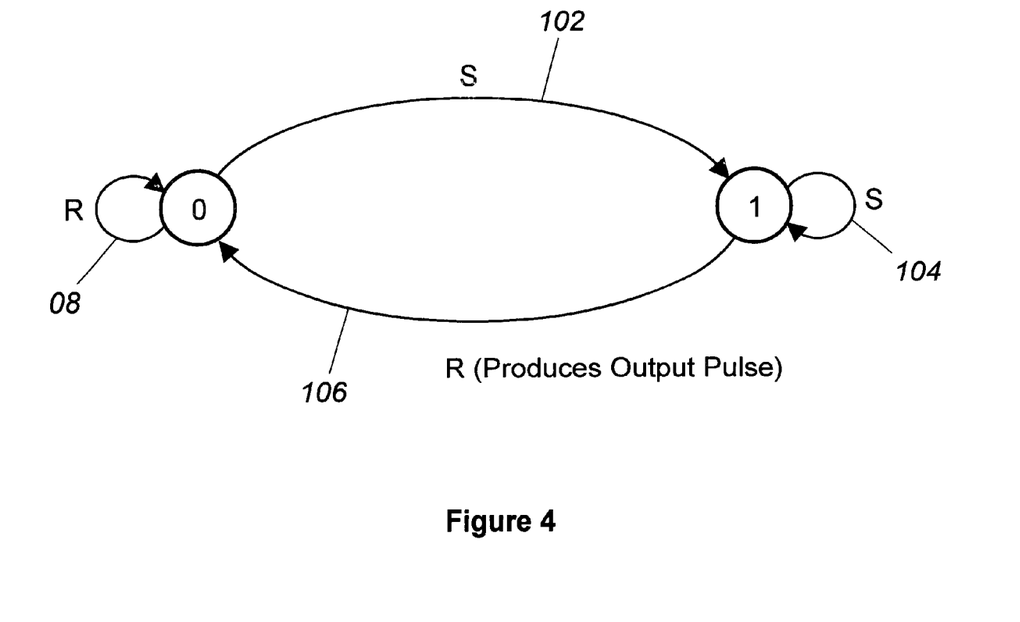
FIG. 4 is a state diagram of a Reset-Set latch gate shown in FIGS. 2 and 3, according to the present invention.

FIG. 4 is a state diagram of the RS latch 64 illustrating the phase and the state transitions of the RS latch 64 in accordance with the present invention. When the first signal is fed into the set port 66 of the RS latch 64 from the splitter circuit 60, a first pulse of the first signal sets the RS latch 64, and changes its phase from "0" to "1" state, step 102. When the first signal includes more than one pulse, the RS latch 64 switches its phase from "0" to "1" state on the first SFQ pulse and the trailing pulses of the first signal are rejected, and the RS latch 64 remains idle so long as no reset pulse is received, step 104. When the delayed signal, which is a replica of the first signal delayed in time, arrives at the reset port 65 of the RS latch 64, the delayed signal sets the RS latch 64 from "1" to "0" state, and produces an output SFQ pulse, step 106. When the delayed signal includes a train of SFQ pulses, the first pulse of the delayed signal resets the RS latch 64 from "1" to "0" state and its trailing pulses retain the RS latch 64 at "0" state, step 108. The RS latch 64 produces a single SFQ output pulse when the RS latch 64 switches its phase from "0" state to "1" state. The trailing SFQ pulses of the first and delayed signals are rejected so long as the duration of the input current to the receiver 50 is less than the delay time (τ) of the delay circuit 62.

Figure 5:
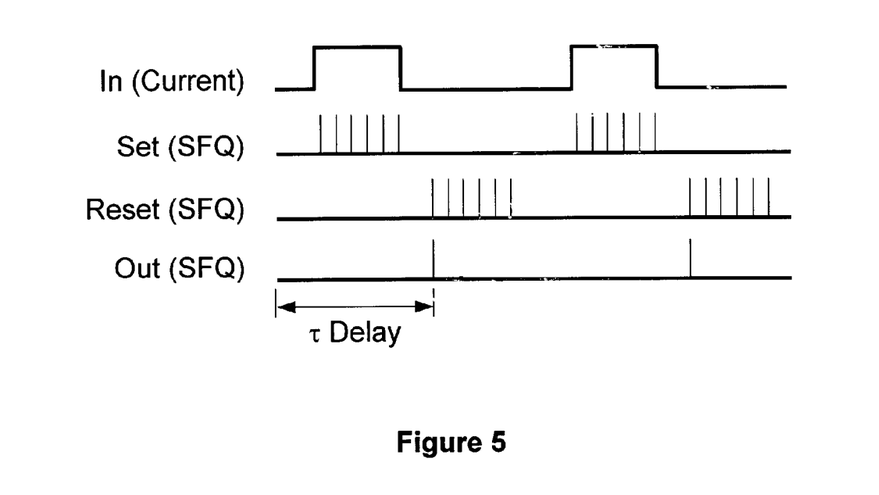
FIG. 5 is a timing diagram of the high-sensitivity, self-clocked receiver, according to the present invention.

FIG. 5 is an exemplary timing diagram illustrating the operation regions of the receiver 50 in accordance with the present invention. When the input current is received by the receiver 50, the Josephson junction 58 of the detector circuit 52 regenerates an SFQ pulse train and transmits it to the splitter circuit 60. As the splitter circuit 60 reproduces the SFQ pulse train, the first signal is fed into the set port of the RS latch 64. The first pulse of the first signal sets the RS latch 64, or changes the RS latch 64 from "0" to "1" state and the trailing pulses are rejected, or retain the RS latch 64 at "1" state. The splitter circuit 60 transmits the input current to the delay circuit 62, which delays the input current in time by τ and generates the delayed signal. τ can be chosen from any period that is longer than the duration of the input current and not greater than one-half the period of the data rate, and more preferably one-half of the period of the data rate of the input current. This implies that the duty cycle of the received signal must not exceed one-half. The delay circuit 62 transmits the delayed signal to the reset port 65 of the RS latch 64. Upon acknowledgement of the delayed signal, the RS latch 64 resets or switches from "1" to "0" state and produces an SFQ output signal. When the delayed signal includes more than one SFQ pulse, the first pulse of the delayed signal resets the RS latch 64 and the trailing pulses are rejected. The SFQ output signal is in the form of a single SFQ pulse that is delayed by τ from the rising edge of the input signal, and an output gate 67 outputs the SFQ output pulse when the RS latch 64 is reset.

Relative to the JTL 10 of FIG. 1, the receiver 50 provides chip-to-chip communication that is asynchronous, and has an improved sensitivity of approximately 0.020 mA in accordance with the present invention. Also, the receiver 50 is self-clocked and the clock period is defined by an internal delay line. The present invention is applicable to any system with multiple chips using high-performance Josephson logic. More specifically, the present invention is applicable to multi-chip systems using logic gates based on single-flux-quantum signals.

Figure 6:
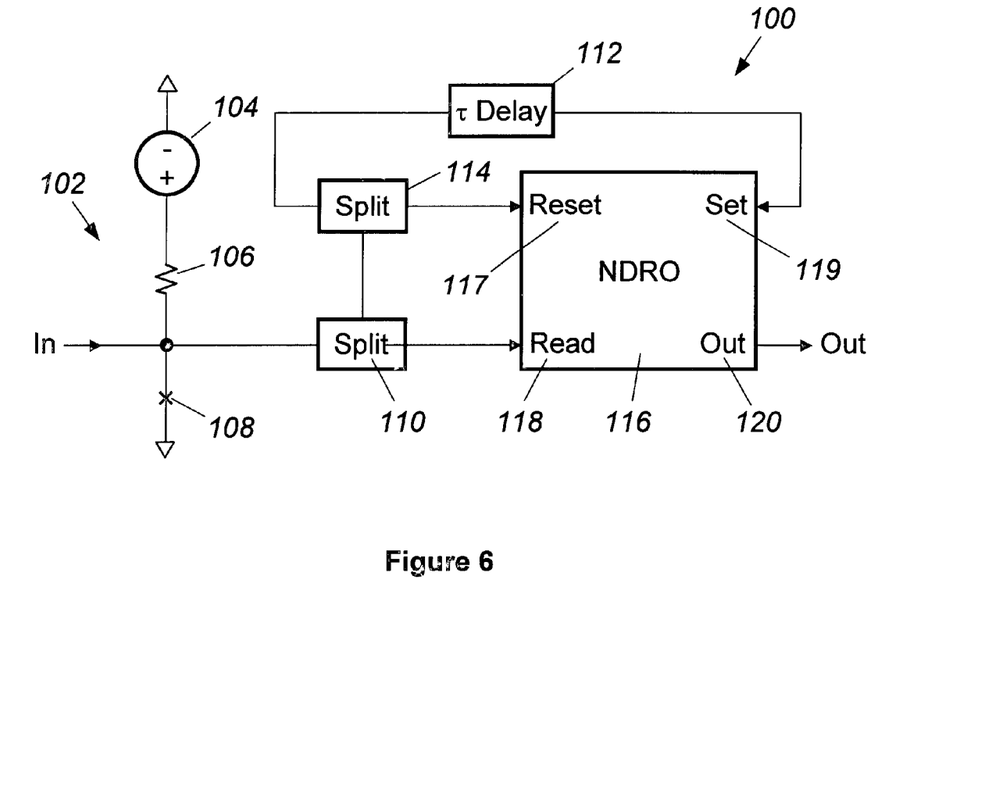
FIG. 6 is a block diagram of another embodiment of the high-sensitivity, self-clocked receiver, according to the present invention.

FIG. 6 shows another embodiment of a high-frequency, self-clocked receiver 100, according to the present invention, that provides chip-to-chip communication through a multi-chip module in the manner discussed above. The receiver 100 replaces the RS latch 64 of the receiver 50 in FIG. 1 with a non-destructive read out (NDRO) gate 116 and a second splitter circuit 114. The receiver 100 further includes a detector circuit 102, a first splitter circuit 110 and a delay circuit 112 which function in the same manner described above. The first splitter circuit 110 transmits the input current to the second splitter circuit 114 which reproduces another copy of the input current, namely a second signal. The second splitter circuit 114 transmits the second signal to the NDRO gate 116 and the input current to the delay circuit 112. The delay circuit 112 produces a delayed signal which is substantially identical to the input current delayed in time by τ. τ may be chosen from any time period that is longer than the duration of the input signal and not greater than one-half the period of data rate. In the present invention, τ is preferably defined by one-half of the period of the data rate of the input current. The first and second splitter circuits 110 and 114 also transmit the first and second signals to read and reset ports 118 and 117, respectively, of the NDRO gate 116. The delay circuit 112 transmits the delayed signal to a set port 119 of the NDRO gate 116.

Figure 7:
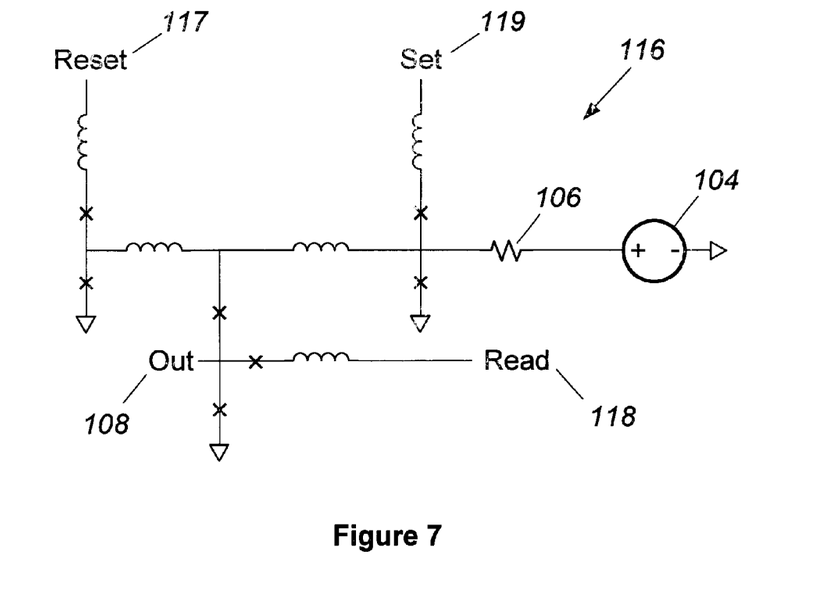
FIG. 7 is a schematic diagram of a Non-Destructive Read-Out switch gate shown in FIG. 6, according to the present invention.
Figure 8:
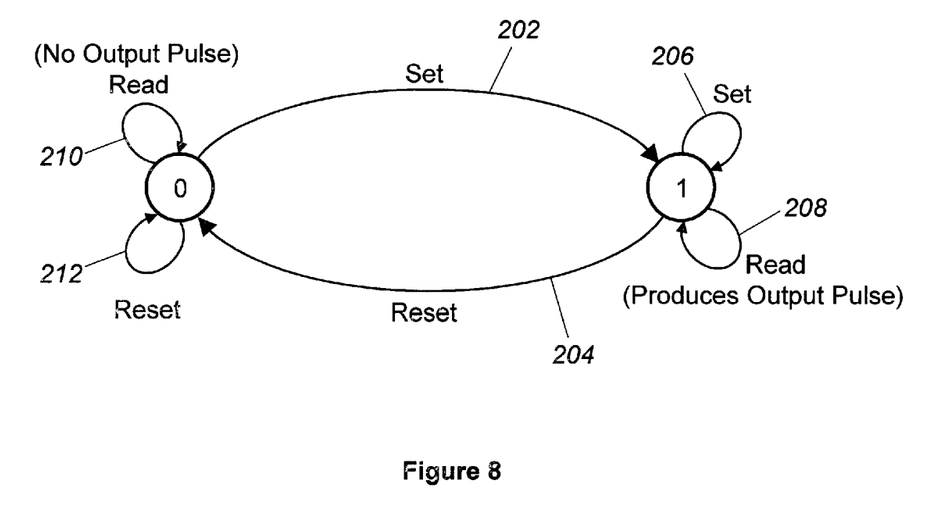
FIG. 8 is a state diagram of the Non-Destructive Read-Out switch gate shown in FIG. 7, according to the present invention.

FIGS. 7–8 are a schematic diagram and a state diagram, respectively, of the NDRO gate 116 illustrating the circuit components and its operations in accordance with the present invention. Initially, the NDRO gate 116 is set at "1" state by a test signal prior to any data transfer. When the first signal is fed into the read port 118 from the first splitter circuit 110, the NDRO gate 116 produces a single SFQ output pulse and rejects the trailing portions of the pulse train when the first signal includes more than one SFQ pulse, step 208. Upon acknowledgement of the first signal fed into the read port 118, an output port 120 outputs the SFQ output pulse to an input port of a gate implemented on the next chip. Subsequently, the second signal from the second splitter 114 is fed into the reset port 117 of the NDRO gate 116 which, in turn, resets the phase of the NDRO gate 116 from "1" to "0" state, step 204. When the input signal includes more than one SFQ pulse, the trailing pulses after the first pulse of the first and second signals are rejected, and the NDRO gate 116 remains idle or stays at its instant state, steps 210 and 212. The input current fed into the reset port 117 of the NDRO gate 116 is implicitly delayed by a small amount of time relative to the input current fed into the read port 118 of the NDRO gate 116. Also, the delayed signal from the delay circuit 112 is fed into the set port 119 of the NDRO gate 116 which sets the NDRO gate 116 from "0" to "1" state, step 202. When multiple SFQ pulses are transmitted, the first pulse of the delayed signal switches the state of the NDRO gate 116 and the trailing pulses are rejected. Additionally, the phase of the NDRO gate 116 remains idle, step 206. The NDRO gate 116 then awaits for the arrival of next input current.

An important advantage of this embodiment is that the output of the receiver 100 has a low latency. The output signal, which mirrors the input signal is produced when the NDRO gate 116 is at "1" state and triggered by the first signal fed into the read port 118. Therefore, the output signal is not delayed by τ period as that of the receiver 50 where the delayed signal triggers the RS latch 64 to produce an SFQ output pulse. This embodiment has a particular application for, but not limited to, devices that require lower-latency data transfers between adjacent chips.

The foregoing discussion describes merely exemplary embodiments of the present invention. One skilled in the art would readily recognize that various changes, modifications and variations can be made therein without departing from the spirit and scope of the invention as defined in the following claims.

What is claimed is:

1. A receiver for providing asynchronous chip-to-chip communication in a superconductor integrated circuit, the receiver comprising:
   a detector circuit for asynchronously receiving an input signal;
   a splitter circuit connected to said detector circuit for generating a first signal that is substantially the same as said input signal;
   a delay circuit receiving said first signal from said splitter circuit for generating a delayed signal that is substantially the same as said input signal delayed in time; and
   a register circuit receiving said first signal from said splitter circuit and said delayed signal from said delay circuit for producing a single flux quantum (SFQ) output pulse.

2. The receiver of claim 1 wherein said input signal and said first signal generated by said splitter circuit have substantially the same voltage amplitude.

3. The receiver of claim 1 wherein said delayed signal is substantially the same as said input signal delayed in time by one-half of the period of a data rate of said input signal.

4. The receiver of claim 1 wherein said register circuit is a non-destructive readout (NDRO) gate.

5. A receiver for providing asynchronous chip-to-chip communication in a superconductor integrated circuit, the receiver comprising:
   a detector circuit for asynchronously receiving an input signal, said detector circuit comprising:
   a current source;
   a biasing resistor connected in series with said current source for biasing said current source; and
   a Josephson Junction for generating at least one single flux quantum (SFQ) pulse when said input signal is above a predetermined level;
   a splitter circuit connected to said detector circuit for generating a first signal that is substantially the same as said input signal;
   a delay circuit receiving said first signal from said splitter circuit for generating a delayed signal that is substantially the same as said input signal delayed in time; and
   a register circuit receiving said first signal from said splitter circuit and said delayed signal from said delay circuit for producing a SFQ output pulse.

6. A receiver for providing asynchronous chip-to-chip communication in a superconductor integrated circuit, the receiver comprising:

a detector circuit for asynchronously receiving an input signal;

a splitter circuit connected to said detector circuit for generating a first signal that is substantially the same as said input signal;

a delay circuit receiving said first signal from said splitter circuit for generating a delayed signal that is substantially the same as said input signal delayed in time; and a register circuit receiving said first signal from said splitter circuit and said delayed signal from said delay circuit for producing a single flux quantum (SFQ) output pulse, said register circuit being a reset/set latch comprising:

a set port receiving said first signal from said splitter circuit for setting said RS latch to "1" state;

a reset port receiving said delayed signal from said delay circuit for setting said RS latch to "0" state; and an output port for generating said SFQ output pulse when said RS latch switches from "1" to "0" state.

7. The receiver of claim 6 wherein said SFQ output pulse generated by said register circuit is delayed by one-half of the period of the data rate of said input signal.

8. A receiver for providing asynchronous chip-to-chip communication in a superconductor integrated circuit, the receiver comprising:

a detector circuit for asynchronously receiving an input signal;

a first splitter circuit connected to said detector circuit for generating a first signal that is substantially the same as said input signal;

a second splitter circuit receiving said first signal from said first splitter circuit for producing a second signal;

a delay circuit receiving said first signal from said first splitter circuit for generating a delayed signal that is substantially the same as said input signal delayed in time;

a register circuit comprising a non-destructive readout (NDRO) gate receiving said first signal from said first splitter circuit and said delayed signal from said delay circuit for producing a single flux quantum (SFQ) output pulse, said NDRO gate comprising:

a read port receiving said first signal from said splitter circuit for generating said SFQ output pulse;

a reset port receiving said second signal from said second splitter circuit for setting said NDRO gate from "1" to "0" state;

a set port receiving said delayed signal from said delay circuit for setting said NDRO gate from "0" to "1" state; and an output port for outputing said SFQ output pulse when said NDRO gate is set at "1" state and receives said input current from said read port.

9. The receiver of claim 8 wherein said second signal and said input signal have substantially the same voltage amplitude.

10. The receiver of claim 8 wherein said output port of said NDRO gate mirrors said input signal received by said read port, and said SFQ output pulse is not delayed in time.

11. A receiver for providing chip-to-chip communication in a superconductor integrated circuit, the receiver comprising:

a detector circuit for asynchronously receiving an input signal;

a splitter circuit receiving said input signal from said detector circuit for generating a first signal that is substantially the same as said input signal;

a delay circuit receiving said first signal from said splitter circuit for generating a delayed signal that is substantially the same as said input signal delayed in time; and a RS latch receiving said first signal from said splitter circuit and said delayed signal from said delay circuit for producing an SFQ output pulse.

12. The receiver of claim 11 wherein said input signal and said first signal generated by said splitter circuit have substantially the same voltage amplitude.

13. The receiver of claim 11 wherein said delayed signal is substantially the same as said input signal delayed in time by one-half of the period of a data rate of said input current.

14. A receiver for providing chip-to-chip communication in a superconductor integrated circuit, the receiver comprising:

a detector circuit for asynchronously receiving an input signal, said detector circuit comprising:
a current source;
a biasing resistor connected in series with said current source for biasing said current source; and
a Josephson junction for generating at least one SFQ pulse when said input signal is above a predetermined level;

a splitter circuit receiving said input signal from said detector circuit for generating a first signal that is substantially the same as said input signal;

a delay circuit receiving said first signal from said splitter circuit for generating a delayed signal that is substantially the same as said input signal delayed in time; and a RS latch receiving said first signal from said splitter circuit and said delayed signal from said delay circuit for producing an SFQ output pulse.

15. A receiver for providing chip-to-chip communication in a superconductor integrated circuit, the receiver comprising:

a detector circuit for asynchronously receiving an input signal, said detector circuit comprising:
a current source;
a biasing resistor connected in series with said current source for biasing said current source; and
a Josephson junction for generating at least one SFQ pulse when said input signal is above a predetermined level;

a splitter circuit receiving said input signal from said detector circuit for generating a first signal that is substantially the same as said input signal;

a delay circuit receiving said first signal from said splitter circuit for generating a delayed signal that is substantially the same as said input signal delayed in time; and a RS latch receiving said first signal from said splitter circuit and said delayed signal from said delay circuit for producing an SFQ output pulse, said RS latch comprising:
a set port receiving said first signal from said splitter circuit for setting said RS latch from "0" to "1" state;
a reset port receiving said delayed signal from delay circuit for setting said RS latch from "1" to "0" state; and
an output port for generating said SFQ output pulse when said RS latch switches from "1" to "0" state.

16. A receiver for providing chip-to-chip communication in a superconductor integrated circuit, the receiver comprising:

a detector circuit for asynchronously receiving an input signal;

a first splitter circuit receiving said input signal from said detector circuit for generating a first signal that is substantially the same as said input current;

a second splitter circuit for receiving said first signal from said first splitter circuit for generating a second signal that is substantially the same as said input signal;

a delay circuit receiving said second signal from said second splitter circuit for generating a delayed signal that is substantially the same as said input signal delayed in time; and a NDRO gate receiving said first signal from said first splitter circuit, said second signal from said second splitter circuit and said delayed signal from said delay circuit for producing an SFQ output pulse.

17. The receiver of claim 16 wherein said input signal and said first and second signals generated by said first and second splitter circuits have substantially the same voltage amplitude.

18. The receiver of claim 16 wherein said second signal is substantially the same as said input signal delayed in time by half the period of a data rate of said input current.

19. The receiver of claim 16 wherein said detector circuit further comprises:

a current source;

a biasing resistor connected in series with said current source for biasing said current source; and a Josephson junction for generating at least one SFQ pulse when said input signal is above a predetermined level.

20. A receiver for providing chip-to-chip communication in a superconductor integrated circuit, the receiver comprising:

a detector circuit for asynchronously receiving an input signal;

a first splitter circuit receiving said input signal from said detector circuit for generating a first signal that is substantially the same as said input current;

a second splitter circuit for receiving said first signal from said first splitter circuit for generating a second signal that is substantially the same as said input signal;

a delay circuit receiving said second signal from said second splitter circuit for generating a delayed signal that is substantially the same as said input signal delayed in time; and a NDRO gate receiving said first signal from said first splitter circuit, said second signal from said second splitter circuit and said delayed signal from said delay circuit for producing an SFQ output pulse, said NDRO gate comprising:

a read port receiving said first signal from said first splitter circuit for generating said SFQ output pulse;

a reset port receiving said second signal from said second splitter circuit for setting said NDRO gate from "1" to "0" state;

a set port receiving said delayed signal from said delay circuit for setting said NDRO gate from "0" to "1" state; and an output port for outputting said SFQ output pulse when said NDRO gate is at "1" state and receives an input signal from said read port.

* * * * *